US012686944B2

(12) United States Patent (10) Patent No.: US 12,686,944 B2
Ushijima et al. (45) Date of Patent: Jul. 21, 2026

(54) POLYCRYSTALLINE SIC ARTICLE

(71) Applicant: TOKAI CARBON CO., LTD., Tokyo (JP)

(72) Inventors: Yuji Ushijima, Tokyo (JP); Takaomi Sugihara, Tokyo (JP); Seiichi Okuyama, Tokyo (JP)

(73) Assignee: TOKAI CARBON CO., LTD, Tokyo (JP)

( * ) Notice: Subject to any disclaimer, the term of this patent is extended or adjusted under 35 U.S.C. 154(b) by 692 days.

(21) Appl. No.: 17/762,776

(22) PCT Filed: Sep. 25, 2020

(86) PCT No.: PCT/JP2020/036407
§ 371 (c)(1),
(2) Date: Mar. 23, 2022

(87) PCT Pub. No.: WO2021/060516
PCT Pub. Date: Apr. 1, 2021

(65) Prior Publication Data
US 2022/0341054 A1     Oct. 27, 2022

(30) Foreign Application Priority Data

Sep. 27, 2019     (JP) ................................. 2019-177463

(51) Int. Cl.
*C30B 29/36*          (2006.01)
*C01B 32/956*         (2017.01)
(Continued)

(52) U.S. Cl.
CPC ............ *C30B 29/36* (2013.01); *C01B 32/956* (2017.08); *C30B 28/14* (2013.01); *C30B 33/06* (2013.01)

(58) Field of Classification Search
CPC ......... C30B 29/36; C30B 28/14; C30B 33/06; B32B 18/00; C04B 2235/722;
(Continued)

(56) References Cited

U.S. PATENT DOCUMENTS 10,415,154 B2     9/2019   Nakamura et al.
10,774,441 B2     9/2020   Nakamura et al.
(Continued)

FOREIGN PATENT DOCUMENTS

CN          103270201 A      8/2013
CN          107275209 A      10/2017
(Continued)

OTHER PUBLICATIONS

Liu et al (Enhanced Ohmic contact via graphitization of polycrystalline silicon carbide, Applied Physics Letters, 2010) (Year: 2010).*
(Continued)

*Primary Examiner* — Anthony J Zimmer
*Assistant Examiner* — Logan Laclair
(74) *Attorney, Agent, or Firm* — Hoffmann & Baron, LLP

(57) ABSTRACT

Provided is a polycrystalline SiC molded body wherein the resistivity is not more than 0.050 Ωcm and, when the peak strength in a wave number range of 760-780 cm$^{-1}$ in a Raman spectrum is regarded as "A" and the peak strength in a wave number range of 790-800 cm$^{-1}$ in the Raman spectrum is regarded as "B", then the peak ratio (A/B) is not more than 0.100.

4 Claims, 4 Drawing Sheets

(51) Int. Cl.
*C30B 28/14* (2006.01)
*C30B 33/06* (2006.01)

(58) Field of Classification Search
CPC ...... C04B 2235/9638; C04B 2237/365; C04B
35/565; C04B 35/62218; C23C 16/01;
C23C 16/325; C23C 16/45512; C23C
16/56; C01P 2002/82; C01P 2006/40;
C01B 32/977
See application file for complete search history.

(56) References Cited

U.S. PATENT DOCUMENTS

| | | | |
|---|---|---|---|
| 10,995,420 B2 | 5/2021 | Nakamura et al. | |
| 2002/0004444 A1 | 1/2002 | Goela et al. | |
| 2003/0036471 A1 | 2/2003 | Goela et al. | |
| 2003/0059568 A1 | 3/2003 | Pickering et al. | |
| 2004/0229395 A1 | 11/2004 | Goela et al. | |
| 2006/0008661 A1 | 1/2006 | Wijesundara et al. | |
| 2013/0062628 A1* | 3/2013 | Das | C30B 25/02 |
| | | | 257/77 |
| 2013/0263774 A1 | 10/2013 | Torimi et al. | |
| 2013/0269597 A1 | 10/2013 | Torimi et al. | |
| 2019/0040545 A1 | 2/2019 | Nakamura et al. | |
| 2019/0226118 A1 | 7/2019 | Nakamura et al. | |
| 2019/0273136 A1 | 9/2019 | Masumoto et al. | |
| 2020/0006493 A1 | 1/2020 | Imaoka et al. | |
| 2020/0270766 A1 | 8/2020 | Nakamura et al. | |
| 2022/0344452 A1 | 10/2022 | Ushijima et al. | |

FOREIGN PATENT DOCUMENTS

| | | |
|---|---|---|
| JP | 06216043 A | 8/1994 |
| JP | H08188408 A | 7/1996 |
| JP | 10158097 A | 6/1998 |
| JP | 11199323 A | 7/1999 |
| JP | 2001220237 A | 8/2001 |
| JP | 2001316821 A | 11/2001 |
| JP | 2002201099 A | 7/2002 |
| JP | 2018035009 A | 3/2018 |
| JP | 6387375 B2 | 9/2018 |
| JP | 2019151543 A | 9/2019 |
| WO | 2014020776 A1 | 2/2014 |
| WO | 2017094764 A1 | 6/2017 |
| WO | 2021060515 A1 | 4/2021 |

OTHER PUBLICATIONS

Kim et al. (Conductive SiC ceramics fabricated by spark plasma sintering, Ceramics International, 2016) (Year: 2016).*
Fu et al (Doped polycrystalline 3C—SiC films with low stress for MEMS: part I. Deposition conditions and film properties, Journal of Micromechanics and Microengineering, 2014) (Year: 2014).*
WebPlotDigitizer (https://web.eecs.utk.edu/~dcostine/personal/PowerDeviceLib/DigiTest/index.html) (Year: 2025).*
Partial Supplementary European Search Report for European Patent Application No. 20869342.4, dated Dec. 7, 2023 (13 Pages).
Extended European Search report for European Patent Application No. 20870427.0, dated Dec. 7, 2023 (8 Pages).
Fu, X. A. et al., "Nitrogen Doped Polycrystalline 3C—SiC Films Deposited By LPCVD For MEMS Applications," Transducers and Eurosensors '07—4th International Conference on Solid-State Sensors, Actuators and Microsystems, (Jun. 2007), pp. 509-512.
L. Rimai, et al., "Pulsed laser deposition of SIC films on fused silica and sapphire substrates", J. Appl. Phys., vol. 73. No. 12, Jun. 15, 1993, pp. 8242-8249.
International Search Report in PCT/JP2020/036405, mailed Dec. 8, 2020.
Written Opinion in PCT/JP2020/036405, mailed Dec. 8, 2020.
International Search Report in PCT/JP2020/036407, mailed Dec. 8, 2020.
Written Opinion in PCT/JP2020/036407, mailed Dec. 8, 2020.
Vera Haase et al. (Authors), Hartmut Katscher et al. (Editors), Friedrich Schröder (Chief Editor), Gmelin Handbook of Inorganic Chemistry, 8th Edition, Si Silicon Supplement vol. B 3 System Si—C. SiC: Natural Occurrence. Preparation and Manufacturing Chemistry. Special Forms. Manufacture. Electrochemical Properties. Chemical Reactions. Applications. Ternary and Higher Systems with Si and C, Springer-Verlag, Berlin, Heidelberg, New York, Tokyo, 1986, pp. 287 and 294.
Vera Haase et al. (Authors), Hartmut Katscher et al. (Editors), Friedrich Schröder (Chief Editor), Gmelin Handbook of Inorganic Chemistry, 8th Edition, Si Silicon Supplement vol. B 3 System Si—C. SiC: Natural Occurrence. Preparation and Manufacturing Chemistry. Special Forms. Manufacture. Electrochemical Properties. Chemical Reactions. Applications. Ternary and Higher Systems with Si and C, Springer-Verlag, Berlin, Heidelberg, New York, Tokyo, 1986, pp. 123-124 and 126.
J. R. Weiss and R. J. Diefendorf, Chemically Vapor Deposited SiC for High Temperature and Structural Applications, pp. 80-91, Silicon Carbide—1973, Proceedings of the Third International Conference on Silicon Carbide held at Miami Beach, Florida, on Sep. 17-20, 1973, Silicon Carbide—1973, edited by R. C. Marshall et al., University of South Carolina Press, Columbia, South Carolina, 1974, First Edition.

* cited by examiner

POLYCRYSTALLINE SIC ARTICLE

This application is the National Stage Entry under 35 U.S.C. § 371 of International Patent Application No. PCT/JP2020/036407, filed Sep. 25, 2020, which in turn claims priority to Japanese Patent Application No. 2019-177463, filed Sep. 27, 2019, the contents of which are incorporated in their entirety by reference herein.

TECHNICAL FIELD

The present invention relates to a polycrystalline SiC article.

BACKGROUND ART

SiC molded bodies are excellent in various properties such as heat resistance, corrosion resistance, and strength, and are used in various applications. For example, Patent Literature 1 (Japanese Patent Application Publication No. 2001-316821) and Patent Literature 2 (Japanese Patent Application Publication No. 2001-220237) describe the use of SiC for members for plasma etching devices such as edge rings, electrode plates, and heaters used in semiconductor manufacture. In addition, Patent Literature 3 (Japanese Patent No. 6387375) describes a semiconductor substrate comprising a single crystal SiC substrate and a polycrystalline SiC substrate, wherein the single crystal SiC substrate and the polycrystalline SiC substrate are joined with a predetermined interstice layer in between.

CITATION LIST

Patent Literatures

Patent Literature 1: Japanese Patent Application Publication No. 2001-316821
Patent Literature 2: Japanese Patent Application Publication No. 2001-220237
Patent Literature 3: Japanese Patent No. 6387375

SUMMARY OF INVENTION

A polycrystalline SiC article is required to have various properties depending on the applications.

For example, as described in Patent Literatures 1 and 2, when a polycrystalline SiC article is used as a member for plasma etching, the polycrystalline SiC article needs to have low resistivity in order to drain static electricity away and to uniformly generate a plasma gas. In addition, the polycrystalline SiC article needs to have a uniform interval with a Si wafer so that the Si wafer is more uniformly processed with plasma, and accordingly the polycrystalline SiC article used as a member for plasma etching devices is required to have a flat surface.

Moreover, as described in Patent Literature 3, in order to join a polycrystalline SiC article and a single crystal SiC substrate, the polycrystalline SiC article needs to have a flat joint surface. In addition, in a case where the polycrystalline SiC article is used in an application such as one in which a current path is formed across the joint surfaces of the polycrystalline SiC article and the single crystal SiC substrate, the polycrystalline SiC article is sometimes required to have low resistivity.

In view of this, an object of the present invention is to provide a polycrystalline SiC article that has low resistivity and excellent flatness.

In order to achieve the above-described object, the present invention includes the following matters.
[1] A polycrystalline SiC article having a resistivity of 0.050 $\Omega$cm or less, and having a peak ratio (A/B) of 0.100 or less, wherein "A" represents a peak intensity within a wave number range of 760 to 780 cm$^{-1}$ in a Raman spectrum, and "B" represents a peak intensity within a wave number range of 790 to 800 cm$^{-1}$ in the Raman spectrum.
[2] The polycrystalline SiC article according to [1], wherein a content of nitrogen is 200 ppm (mass parts per million) or more.

According to the present invention, a polycrystalline SiC article that has excellent flatness and low resistivity is provided.

DESCRIPTION OF EMBODIMENTS

An embodiment of the present invention will be described in detail below with reference to the drawings. The detailed description of the present invention below is one illustration of the embodiment, and the present invention should not be interpreted as being limited to the present embodiment at all.

Figure 1:
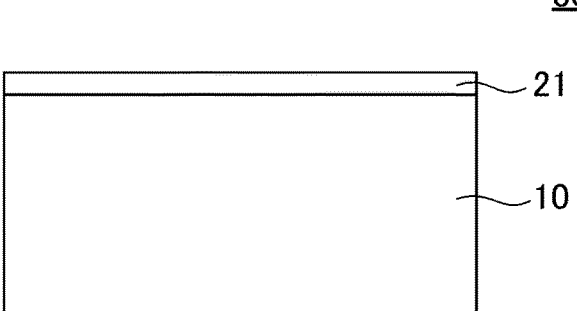
FIG. 1 is a schematic cross-sectional view illustrating a stacked SiC substrate according to an embodiment.

FIG. 1 is a schematic cross-sectional view illustrating a stacked SiC substrate 30 according to the present embodiment. As illustrated in FIG. 1, the stacked SiC substrate 30 includes a polycrystalline SiC article 10 and a single crystal SiC layer 21.

The polycrystalline SiC article 10 is provided to support the single crystal SiC layer 21. The polycrystalline SiC article 10 has a plate shape, and has a thickness to the extent that allows the polycrystalline SiC article 10 to be easily handled, and has, for example, a thickness of about 300 to 500 μm.

The above-described stacked SiC substrate 30 can be fabricated, for example, by the following procedure.

Figure 2A:
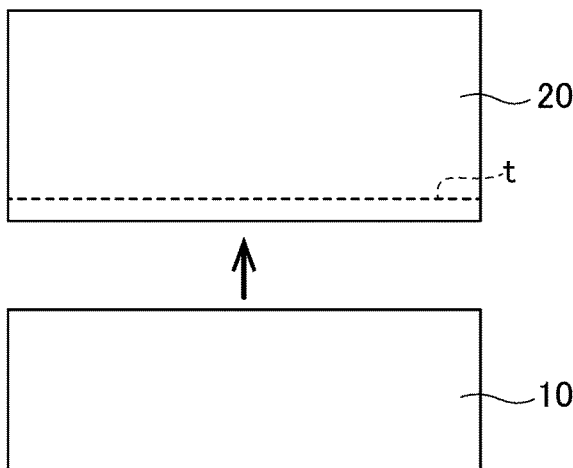
FIG. 2A is a schematic cross-sectional view illustrating a method for fabricating a stacked SiC substrate.
Figure 2B:
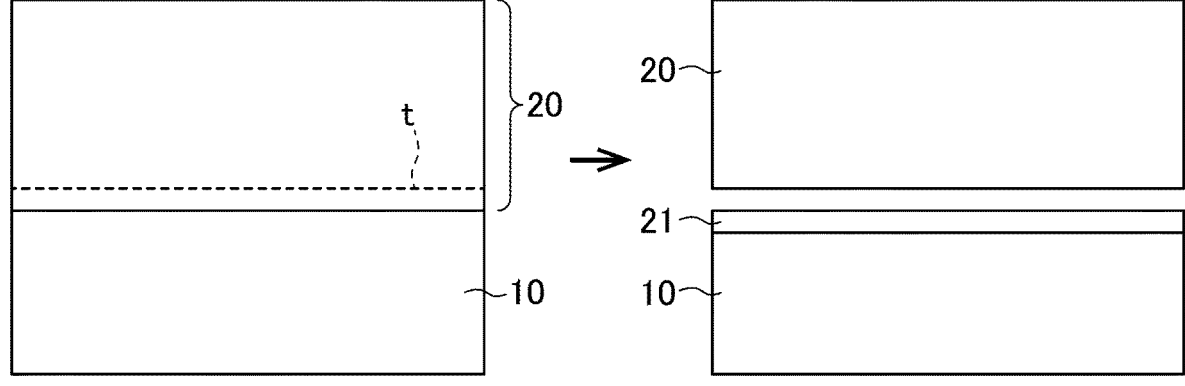
FIG. 2B is a schematic cross-sectional view illustrating the method for fabricating a stacked SiC substrate.

First, as illustrated in FIG. 2A, a polycrystalline SiC article 10 and a single crystal SiC substrate 20 each having a certain thickness are prepared. Surfaces of the polycrystalline SiC article 10 and the single crystal SiC substrate 20 to be joined are referred to as a joint surface of the polycrystalline SiC article 10 and a joint surface of the single crystal SiC substrate 20. Hydrogen ions are injected into a region at a uniform depth from the joint surface of the single crystal SiC substrate 20 from a direction opposite to the joint surface of the single crystal SiC substrate 20 to form a fragile layer t in the region at the uniform depth from the joint surface of the single crystal SiC substrate 20. Here, the fragile layer t is indicated by a dotted line in FIG. 2A and FIG. 2B, and is a layer embedded in the region at the uniform depth from the joint surface of the single crystal SiC substrate 20. Subsequently, the joint surface of the single crystal SiC substrate 20 and the joint surface of the polycrystalline SiC article 10 are irradiated with an argon beam to activate these surfaces. Then, the activated joint surface of the single crystal SiC substrate 20 and the activated joint surface of the polycrystalline SiC article 10 are arranged such that the joint surface of the single crystal SiC substrate 20 and the joint surface of the polycrystalline SiC article 10 face each other, and these joint surfaces are joined. Thereafter, as illustrated in FIG. 2B, the single crystal SiC substrate 20 and the polycrystalline SiC article 10 joined at these joint surfaces are separated at the fragile layer t as a boundary between the single crystal SiC substrate 20 and the polycrystalline SiC article 10. At this time, part of the single crystal SiC substrate 20 (hereinafter, a single crystal SiC layer 21) that is separated at the fragile layer t as the boundary is fixed on the joint surface of the polycrystalline SiC article 10. In this way, the stacked SiC substrate 30 as illustrated in FIG. 1 is obtained.

The single crystal SiC layer 21 is a portion where a semiconductor circuit is to be formed. On the single crystal SiC layer 21, a single crystal layer for forming the semiconductor circuit is formed by epitaxial growth, and the semiconductor circuit is formed through predetermined processing steps. The thickness of the single crystal SiC layer 21 only has to be a thickness to the extent that allows a single crystal layer to be grown on the single crystal SiC layer 21 by epitaxial growth, and is sufficiently smaller than that of the polycrystalline SiC article 10. For example, the thickness of the single crystal SiC layer 21 is about 0.5 μm.

According to the stacked SiC substrate 30 as described above, since the polycrystalline SiC article 10 functions as a support substrate, it is possible to make the thickness of the single crystal SiC layer 21 smaller than that of the single crystal SiC substrate 20. Single crystal SiC materials are generally more expensive than polycrystalline SiC materials. By making the thickness of the single crystal SiC layer 21 small, it is possible to reduce material costs, and to thus fabricate the stacked SiC substrate 30 for manufacturing semiconductor devices at low costs.

On the other hand, the polycrystalline SiC article 10 used in the stacked SiC substrate 30 as described above is required to have a flat surface for joining with the single crystal SiC substrate 20. If the joint surface of the polycrystalline SiC article 10 is not flat, it will be difficult to appropriately join the polycrystalline SiC article 10 and the single crystal SiC substrate 20.

In addition, there is a case where a current flows across the joint surfaces of the polycrystalline SiC article 10 and the fragile layer t during operation, depending on application of the stacked SiC substrate 30. In such a case, it is required to make the contact resistance in the joint surfaces of the polycrystalline SiC article 10 and the single crystal SiC layer 21 small. In order to make the contact resistance small, the polycrystalline SiC article 10 is required to have low resistivity.

In order to meet the above-described requirements, in the present embodiment, the polycrystalline SiC article 10 is contrived to have a flat joint surface and a low resistivity. Hereinafter, the polycrystalline SiC article 10 will be described in detail.

The polycrystalline SiC article 10 has a resistivity of 0.050 Ωcm or less. Having such a resistivity makes it possible to suppress a potential barrier in the joint surfaces of the polycrystalline SiC article 10 and the single crystal SiC layer 21, and to thus improve the responsiveness of the device. In addition, the resistivity of the polycrystalline SiC article 10 is preferably 0.030 Ωcm or less, and further preferably 0.020 Ωcm or less, from the viewpoint of securing a stable responsiveness of the device.

The resistivity can be adjusted, for example, by adding a predetermined amount of nitrogen to the polycrystalline SiC article 10. The resistivity can be reduced by increasing the content of nitrogen.

The content of nitrogen in the polycrystalline SiC article 10 is, for example, 200 ppm (mass parts per million) or more, and preferably 200 to 1000 ppm (mass parts per million). In the case where the content of nitrogen is within such a range, the degree of change in resistivity becomes small relative to change in the content of nitrogen. Hence, it becomes easier to obtain a desired resistivity by controlling the content of nitrogen. In addition, when the content of nitrogen is 1000 ppm (mass parts per million) or less, crystal defects which are generated by introduction of nitrogen hardly affect the flatness of the substrate.

Note that the method for introducing nitrogen is not particularly limited. For example, it is possible to introduce nitrogen into the polycrystalline SiC film to be formed by using a nitrogen-containing gas in forming the polycrystalline SiC film by a CVD method, as described later.

The polycrystalline SiC article 10 has a surface structure having a predetermined crystal structure.

Specifically, the polycrystalline SiC article 10 has a surface structure in which a Raman peak ratio (A/B) is 0.100 or less wherein "A" represents an intensity (maximum value) of a peak (hereinafter referred to as a peak A) within a wave number range of 760 to 780 cm$^{-1}$ in a Raman spectrum, and "B" represents an intensity (maximum value) of a peak (hereinafter referred to as a peak B) within a wave number range of 790 to 800 cm$^{-1}$ in the Raman spectrum.

Here, the peak A is a peak indicating a stacking fault of the polycrystalline SiC material.

On the other hand, the peak B is a peak indicating β-SiC.

When the Raman peak ratio (A/B) is 0.100 or less, it means that the concentration of the stacking fault in the surface structure which the polycrystalline SiC article 10 has is sufficiently small. The stacking fault is one of the causes of warpage of a substrate. By setting the Raman peak ratio (A/B) to 0.100 or less, it is possible to reduce warpage of the polycrystalline SiC article 10, and to thus provide the polycrystalline SiC article 10 having a flat surface structure (joint surface).

Subsequently, a method for manufacturing the polycrystalline SiC article 10 will be described. The polycrystalline SiC article 10 having the properties as described above can be manufactured by employing a specific manufacturing method using a CVD method as described below.

Figure 3:
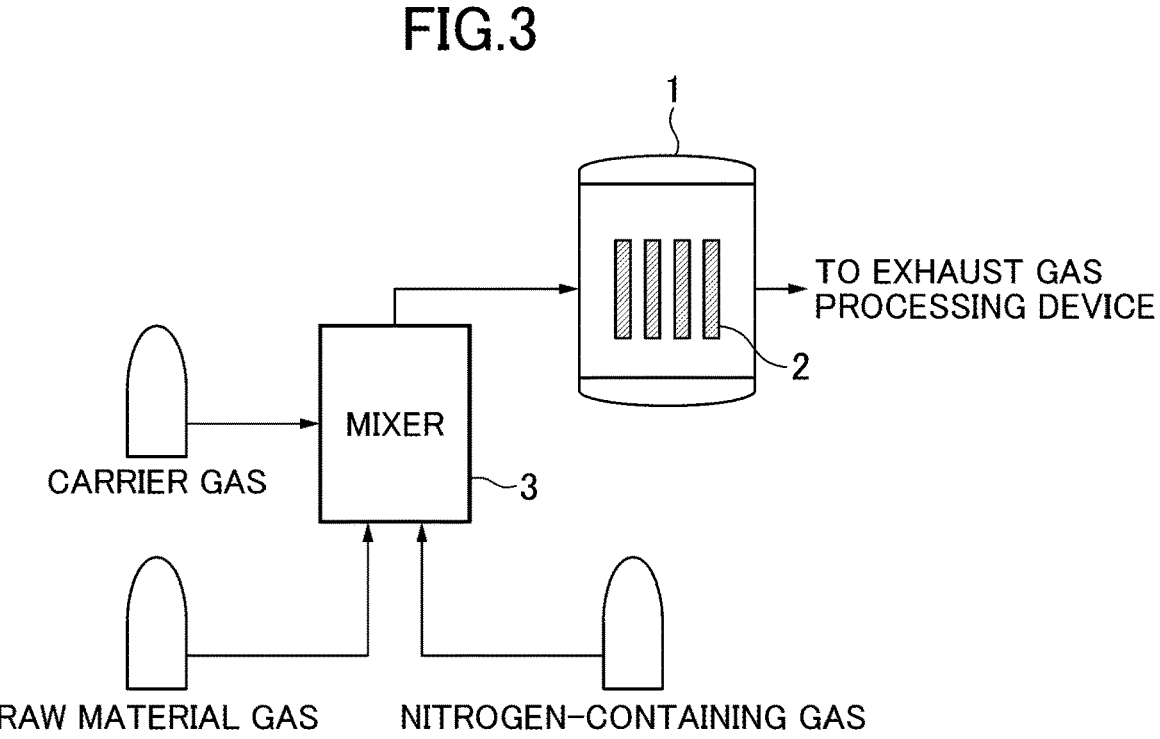
FIG. 3 is a schematic diagram illustrating an example of a manufacturing system used in a method for manufacturing a polycrystalline SiC substrate.

FIG. 3 is a schematic diagram illustrating an example of a manufacturing system used in the method for manufacturing the polycrystalline SiC article 10 according to the present embodiment. This manufacturing system includes a CVD furnace 1 and a mixer 3. The mixer 3 mixes a carrier gas, a raw material gas which serves as a supply source of SiC, and a nitrogen-containing gas to generate a mixed gas. The mixed gas is supplied from the mixer 3 to the CVD furnace 1. In the CVD furnace 1, a plurality of graphite substrates 2 are arranged. The graphite substrates 2 each have a circular plate shape. When the mixed gas is supplied to the CVD furnace 1, a polycrystalline SiC film is formed on each graphite substrate 2 by the CVD method. In addition, each polycrystalline SiC film is doped with nitrogen derived from the nitrogen-containing gas. This polycrystalline SiC film is separated from the graphite substrate 2 and is subjected to flat surface grinding to form this polycrystalline SiC film into the polycrystalline SiC article 10.

Note that as the raw material gas, which serves as the supply source of SiC, a one component-based gas (gas containing Si and C) or a two component-based gas (gas containing Si and gas containing C) may be used.

Here, in order to obtain a polycrystalline SiC article 10 having a flat surface, in the present embodiment, a raw material gas concentration in the formation by the CVD method is contrived. Note that in the present invention, the raw material gas concentration means the volume percentage (vol %) of the raw material gas to the total amount of the raw material gas and the carrier gas.

Figure 4:
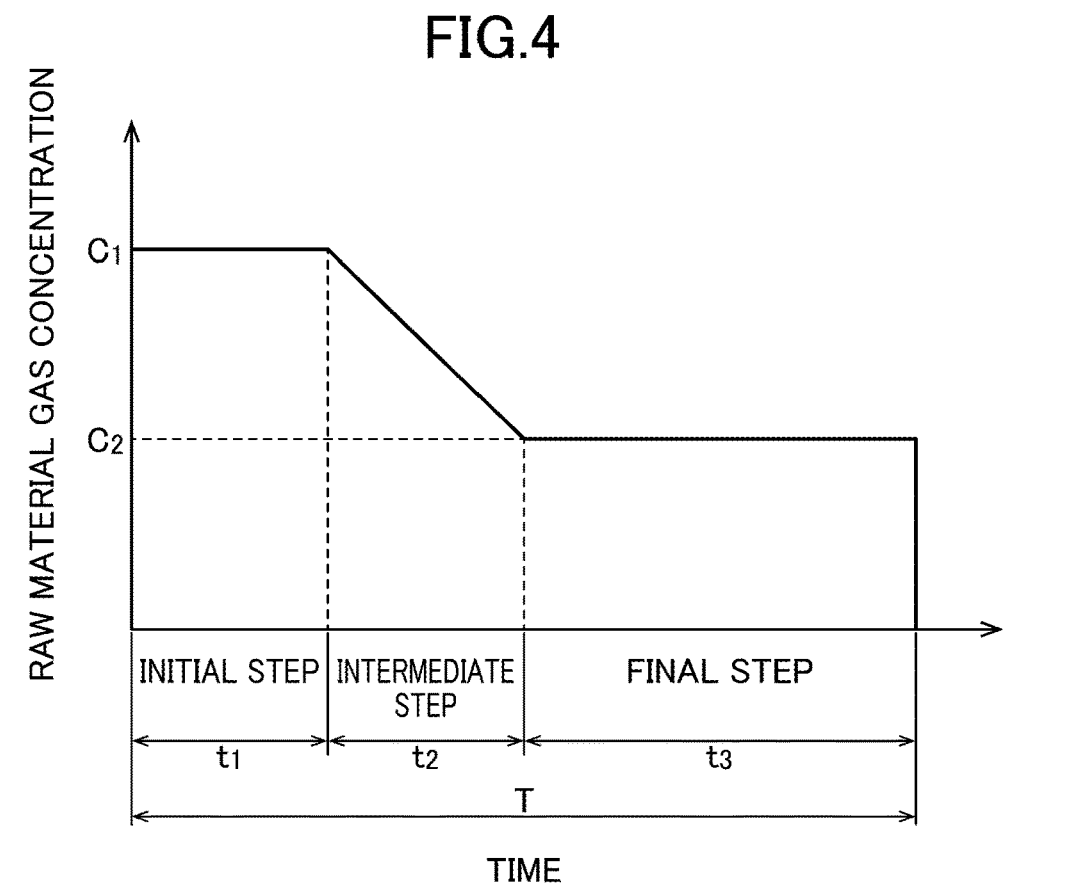
FIG. 4 is a graph conceptually illustrating a relation between time and a raw material gas concentration in film formation.

FIG. 4 is a graph conceptually illustrating a relation between time and the raw material gas concentration in the film formation. As illustrated in FIG. 4, the manufacturing method according to the present embodiment includes an initial step, an intermediate step, and a final step. The initial step, an intermediate step, and a final step are continuously performed.

First, in the initial step, a first polycrystalline SiC film is formed on a graphite substrate 2 at a raw material gas concentration of a first concentration $C_1$.

Subsequently, in the intermediate step, a second polycrystalline SiC film is formed on the first polycrystalline SiC film while reducing the raw material gas concentration from the first concentration $C_1$ to a second concentration $C_2$. The raw material gas concentration is preferably reduced at a constant rate.

Moreover, in the final step, a third polycrystalline SiC film is formed at the raw material gas concentration of the second concentration $C_2$.

According to the finding of the present inventors, in a case where a polycrystalline SiC film is formed by the CVD method with a constant raw material gas concentration, there is a tendency that the crystal grain size is small in the initial stage of the film formation, and the crystal grain size increases as the film formation proceeds into the later stage. In contrast, by setting a high raw material gas concentration in the initial step and reducing the raw material gas concentration in the later steps as in the present embodiment, it is made easy to align the magnitudes of the crystal grain sizes of the entire polycrystalline SiC films including the first, second, and third polycrystalline SiC films through the entire film formation period. It is possible to reduce the concentration of stacking faults and to thus obtain a polycrystalline SiC film having less warpage by aligning the magnitudes of the crystal grain sizes.

The period (period $t_1$) of the initial step is not particularly limited, but is, for example, 10 to 50% of the entire period (T) of the formation of the polycrystalline SiC films.

The period (period $t_2$) of the intermediate step is also not particularly limited, but is, for example, 10 to 50% of the entire period (T) of the formation of the polycrystalline SiC films.

The period (period $t_3$) of the final step is also not particularly limited, but is, for example, 30 to 70% of the entire period (T) of the formation of the polycrystalline SiC films.

The entire period (T) of the formation of the polycrystalline SiC films is not particularly limited, but is, for example, 1 to 20 hours, and preferably 5 to 15 hours.

The film thickness of the polycrystalline SiC films to be formed is, for example, 500 to 6000 μm, and preferably 450 to 5500 μm.

The carrier gas to be used in the film formation is not particularly limited, but a hydrogen gas or the like may be used, for example.

The raw material gas is not particularly limited as long as the gas contains the supply source of Si and C. For example, a gas containing Si and C in a molecule, a mixed gas of a gas containing Si in a molecule and a hydrocarbon gas, or the like may be used.

The raw material gas includes, for example, trichloromethylsilane, trichlorophenylsilane, dichloromethylsilane, dichlorodimethylsilane, and chlorotrimethylsilane in the case of a one component-based gas. In addition, the raw material gas includes a mixture of a silane-containing gas such as trichlorosilane or monosilane and a hydrocarbon gas in the case of a two component-based gas.

Specific conditions for the film formation by the CVD are not particularly limited, but, for example, the following conditions may be employed.

The concentration (first concentration C1) of the raw material gas in the initial step only has to be larger than that (second concentration C2) in the final step. From the viewpoint of suppressing the warpage of the polycrystalline SiC article, the first concentration is preferably 1.2 to 2.0 times the second concentration in order to align the SiC crystal grain sizes through the entire period of the film formation, the first concentration is more preferably 1.3 to 1.8 times the second concentration in order to stably obtain one in which the SiC crystal grain sizes are aligned, and the first concentration is further preferably 1.4 to 1.6 times the second concentration in order to stably and efficiently obtain one in which the SiC crystal grain sizes are aligned.

The second concentration C2 is, for example, 3 to 40 vol %, and preferably 5 to 20 vol %.

The gas residence time in the CVD furnace is, for example, 10 to 200 seconds, and preferably 20 to 100 seconds.

The reaction temperature is, the temperature is, for example, 1100 to 1900° C., and preferably 1400 to 1600° C.

The flow rate of the nitrogen-containing gas is, for example, 5 to 100 vol %, and preferably 10 to 70 vol % relative to the total flow rate of the flow rate of the raw material gas and the flow rate of the carrier gas.

For example, in a case where the raw material gas is a gaseous raw material, the raw material gas concentration can be adjusted by controlling the flow rate of the raw material gas and the flow rate of the carrier gas. In addition, in a case where the raw material gas is a gas derived from a liquid raw material, the raw material gas concentration can be adjusted by controlling the temperature of the liquid raw material in the raw material tank and controlling the vapor pressure of the liquid raw material.

After the steps of forming the polycrystalline SiC film by the CVD method are completed, each graphite substrate 2 on which the polycrystalline SiC film 4 is formed is taken out of the CVD furnace 1, and thereafter, as necessary is processed to take out only the polycrystalline SiC article 10.

Figure 5A:
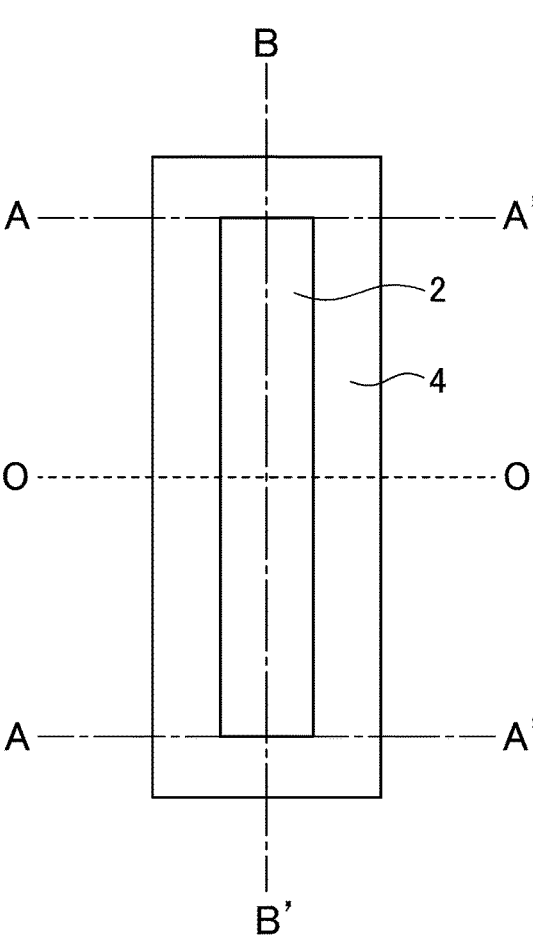
FIG. 5A is a schematic cross-sectional view illustrating a radial cross-section of a graphite substrate 2 on which a polycrystalline SiC film 4 is formed.
Figure 5B:
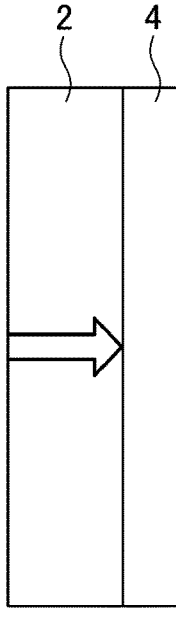
FIG. 5B is a schematic cross-sectional view illustrating a radial cross-section of the graphite substrate 2 on which the polycrystalline SiC film 4 is formed, obtained by removing the polycrystalline SiC film 4 on the outer periphery of the circle plate, and thereafter equally dividing and cutting the thickness of the graphite substrate 2.

FIG. 5A is a schematic diagram illustrating a radial cross-section of the graphite substrate 2 having a center line O-O' on which the polycrystalline SiC film 4 is formed. Here, on the graphite substrate 2, the polycrystalline SiC film 4 is formed to cover the entire surface of the graphite substrate 2. For example, the graphite substrate 2 on which the polycrystalline SiC film 4 is formed is first processed in the outer periphery. Particularly, only the outer peripheral portion of the graphite substrate 2 on which the polycrystalline SiC film 4 is formed is cut and removed off along break lines A-A' illustrated in FIG. 5A. Subsequently, the graphite substrate 2 on which the polycrystalline SiC film 4 is formed is cut and divided into two in a thickness direction, along a line that equally divides the thickness of the graphite substrate 2, that is, a break line B-B' illustrated in FIG. 5A. As a result, as illustrated in FIG. 5B, a stacked body of the graphite substrate 2 and the polycrystalline SiC film 4 is obtained. Further subsequently, only the graphite substrate 2 is removed from the stacked body by the oxidation or shot blasting method, or the like. Thereafter, the exposed surface of the polycrystalline SiC film 4, which is exposed by the removal of the graphite substrate 2, is ground by a grinding process or the like. It is possible to obtain the polycrystalline SiC article 10 by the above-described exemplary processing method.

As described above, according to the present embodiment, since a polycrystalline SiC film having a surface structure in which the Raman peak ratio (A/B) is 0.100 or less is obtained, it is possible to achieve a polycrystalline SiC substrate 10 having a flat surface.

In addition, since the content of nitrogen is controlled to a predetermined value, it is possible to obtain a polycrystalline SiC article 10 having a low resistivity.

Note that in the present embodiment, the case where the polycrystalline SiC article 10 is joined to the single crystal SiC layer 21 to be used as the stacked SiC substrate 30 has been described. Since the polycrystalline SiC article 10 having a low resistivity and having a flat surface can be obtained according to the present embodiment, the present embodiment is favorably used in such applications. However, the polycrystalline SiC article 10 according to the present embodiment is not limited to one that is to be joined to the single crystal SiC substrate 20 for use, but can also be favorably applied to another application as long as the application requires a high flatness and a low resistivity.

Moreover, as shown in the above embodiment, the polycrystalline SiC article according to the present invention can be favorably used in the case where the polycrystalline SiC article is joined to a single crystal SiC layer, and can be similarly applied to the SIMOX method, the ELTRAN method, and other publicly-known joining methods beside the case shown in the above embodiment.

For example, the polycrystalline SiC article according to the present embodiment is used for an edge ring, an electrode plate, a heater, and the like as a members for plasma etching devices in semiconductor manufacture. In addition, the polycrystalline SiC article is used for a dummy wafer as a member for a semiconductor thermal processing device in semiconductor manufacture.

Note that in the case of use as an edge ring and an electrode plate, the polycrystalline SiC substrate has a thickness of about 2000 to 5000 μm, for example. In addition, in the case of use as a dummy wafer, the polycrystalline SiC substrate has a thickness of about 300 to 1000 μm, for example.

EXAMPLES

Hereinafter, Examples performed by the present inventors will be described in order to explain the present invention in more detail. However, the present invention is not interpreted as being limited to the following Examples.

Example 1

A graphite substrate having a diameter of 160 mm and a thickness of 5 mm was set in a CVD furnace. Trimethylchlorosilane (raw material gas), hydrogen (carrier gas), and nitrogen gas were introduced into the CVD furnace and a polycrystalline SiC film was formed on the graphite substrate at 1500° C. for 10 hours.

Film formation conditions are shown in Table 1.

Note that the concentration of the raw material gas was changed among the initial stage of the film formation (from the start of the film formation to 2.5 hours), the intermediate stage of the film formation (from 2.5 hours after the start of the film formation to 5 hours), and the final stage of the film formation (from 5 hours after the start of the film formation to 10 hours). Specifically, the raw material gas concentration (first concentration) in the initial stage of the film formation was set to 9.0 vol %, and the raw material gas concentration (second concentration) in the final stage of the film formation was set to 7.5 vol %.

That is, the ratio of the raw material gas concentration in the initial stage of the film formation to the raw material gas concentration in the final stage of the film formation (hereinafter referred to as the raw material gas concentration ratio) was set to 1.2 times. In addition, in the intermediate stage of the film formation, the raw material gas concentration was reduced at a constant rate from the concentration in the initial stage of the film formation to the concentration in the final stage of the film formation. Note that the flow rate of the raw material gas and the flow rate of the carrier gas were controlled such that the value of the sum of the flow rates became constant (140 L/min).

In addition, the flow rate of the nitrogen gas was set to be constant throughout the entire period of the film formation. Specifically, the flow rate of the nitrogen gas was set to 19.0 (L/min).

The gas residence time was 43.7 (sec). Note that the gas residence time was calculated in accordance with the following formula:

$$\text{The gas residence time (sec)} = \text{(the inner volume of the furnace/the flow rate of the gas)} \times ((20+273)/(\text{the reaction temperature}+273)) \times 60 \qquad \text{(Math. 1):}$$

After the film formation, the graphite substrate was taken out of the CVD furnace, and was subjected to the outer periphery processing and the separation processing. Moreover, the graphite base material was removed to obtain a polycrystalline SiC article having a diameter of 150 mm and a thickness of 0.6 mm. Furthermore, a polycrystalline SiC article having a diameter of 150 mm and a thickness of 0.4 mm was obtained by the flat surface grinding processing. This was obtained as a polycrystalline SiC article according to Example 1.

Examples 2 to 6, Comparative Examples 1 to 2

Polycrystalline SiC molded bodies according to Examples 2 to 6 and Comparative Examples 1 to 2 were obtained using the same method as in Example 1 except that the film formation conditions were changed as described in Table 1. Note that in Comparative Example 1, the flow rate of the raw material gas was set to be constant (10.50 L/min).

(Measurement of Resistivity)

The resistivity of each of the polycrystalline SiC molded bodies obtained in Examples and Comparative Examples was measured by the 4-pin probe method. Loresta GP MCT-T610 manufactured by Mitsubishi Chemical Corporation Analytech Co., Ltd. was used for the measurement of resistivity.

(Measurement of Raman Spectrum)

The Raman spectrum of each obtained polycrystalline SiC article was measured under the following conditions using a microscopic Raman Spectroscopy device, LabRAM-HR800 manufactured by Horiba, Ltd.

Excitation wavelength: 532 nm

Irradiation diameter: Φ2 μm

Exposure time: 15 seconds

Cumulated number: 2

Grating: 1800 gr/mm

The Raman spectrum of each obtained polycrystalline SiC article measured under the above conditions was processed as follows to calculate the peak ratio (A/B). First, the arithmetic mean value of Raman scattering intensities within a wave number range of 850 to 900 $cm^{-1}$ was used as a background correction value. Next, the peak intensity in the Raman spectrum at a wave number of 766 $cm^{-1}$ and the peak intensity in the Raman spectrum at a wave number of 795 $cm^{-1}$ were obtained, and the above background correction value was subtracted from these values to obtain the peak values with the background removed. At this time, the peak intensity at the wave number of 766 $cm^{-1}$ was set as "A", and the peak intensity at the wave number of 795 $cm^{-1}$ was set as "B". The peak ratio (A/B) was calculated from these values.

(Measurement of Amount of Warpage)

In addition, the amount of warpage of each obtained polycrystalline SiC article was measured using an optical interferometry warpage measuring device (FlatMaster 200XRA-Indurstrial manufactured by Corning Tropel Corp).

(Measurement of Content of Nitrogen)

The content of nitrogen in each polycrystalline SiC article was measured using SIMS-4000 manufactured by ATOMIKA.

(Consideration of Results)

Figure 6:
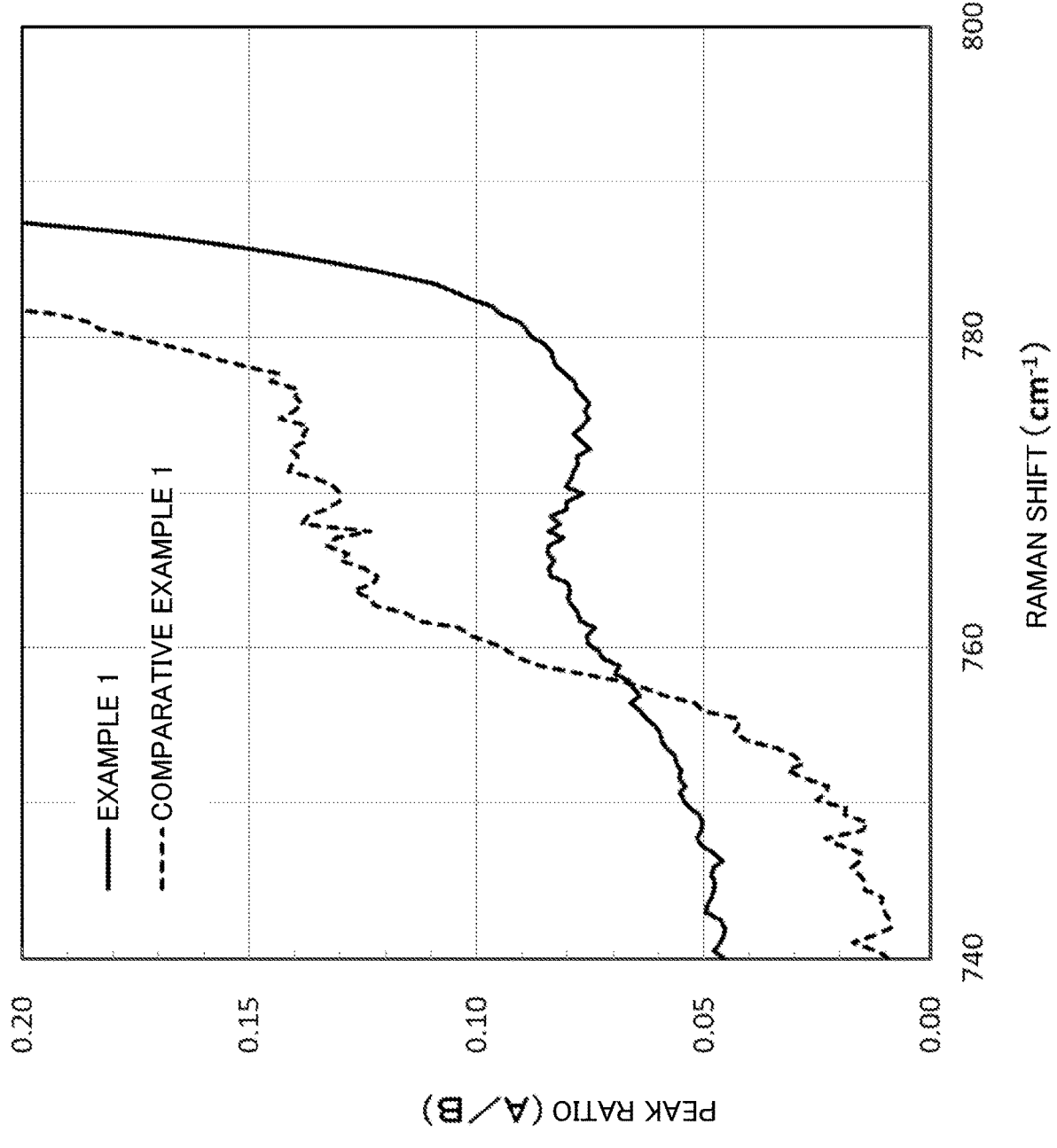
FIG. 6 is a graph representing peak ratios (A/Bs) calculated respectively from Raman spectra of polycrystalline SiC molded bodies obtained in Example 1 and Comparative Example 1.

The results of measuring the resistivity, the peak ratio in the Raman spectrum, the amount of warpage, and the content of nitrogen are shown in Table 1. In addition, FIG. 6 shows a graph representing peak ratios (A/Bs) calculated respectively from the Raman spectra of the polycrystalline SiC molded bodies obtained in Example 1 and Comparative Example 1.

Examples 1 to 6 had smaller amounts of warpage than Comparative Examples 1 and 2. The peak ratios in the Raman spectra of Examples 1 to 6 were 0.100 or less. On the other hand, the peak ratios in Comparative Examples 1 and 2 exceeded 0.100. That is, it is understood that a flat polycrystalline SiC substrate is obtained when the peak ratio in the Raman spectrum is 0.100 or less.

In addition, in all Examples 1 to 6, the content of nitrogen was 200 to 1000 ppm (mass parts per million), and the resistivity value was 0.050 Ωcm or less. In general, as the content of nitrogen increases, the crystal defect increases, which would cause warpage. However, from the results of Examples 1 to 6, it was found that the warpage was also sufficiently suppressed if the content of nitrogen was 1000 ppm (mass parts per million) or less.

TABLE 1

| | Initial step | | | Final step | | | | | | | | | |
|---|---|---|---|---|---|---|---|---|---|---|---|---|---|
| | Flow rate of raw material gas (L/min) | Flow rate of carrier gas (L/min) | First concentration (%) | Flow rate of raw material gas (L/min) | Flow rate of carrier gas (L/min) | Second concentration (%) | Flow rate of nitrogen gas (L/min) | Gas residence time (sec) | Raw material gas concentration ratio | Resistivity (Ωcm) | Nitrogen content (ppm) | Raman Peak ratio | Warpage (μm) |
| Ex. 1 | 12.60 | 127.40 | 9.00 | 10.50 | 129.50 | 7.50 | 19.0 | 43.7 | 1.2 | 0.050 | 205 | 0.080 | 45 |
| Ex. 2 | 14.70 | 125.30 | 10.50 | 10.50 | 129.50 | 7.50 | 37.5 | 39.1 | 1.4 | 0.017 | 295 | 0.015 | 25 |
| Ex. 3 | 15.75 | 124.25 | 11.25 | 10.50 | 129.50 | 7.50 | 72.5 | 32.7 | 1.5 | 0.013 | 415 | 0.000 | 13 |
| Ex. 4 | 16.80 | 123.20 | 12.00 | 10.50 | 129.50 | 7.50 | 19.0 | 43.7 | 1.6 | 0.045 | 220 | 0.085 | 26 |
| Ex. 5 | 18.90 | 121.10 | 13.50 | 10.50 | 129.50 | 7.50 | 37.5 | 39.1 | 1.8 | 0.025 | 305 | 0.040 | 25 |
| Ex. 6 | 21.00 | 119.00 | 15.00 | 10.50 | 129.50 | 7.50 | 72.5 | 32.7 | 2.0 | 0.007 | 960 | 0.090 | 36 |
| C.E. 1 | 10.50 | 129.50 | 7.50 | 10.50 | 129.50 | 7.50 | 72.5 | 32.7 | 1.0 | 0.019 | 400 | 0.130 | 90 |
| C.E. 2 | 8.40 | 131.60 | 6.00 | 10.50 | 129.50 | 7.50 | 19.0 | 43.7 | 0.8 | 0.042 | 310 | 0.180 | 120 |

REFERENCE SIGNS LIST

1 CVD furnace
2 graphite substrate
3 mixer
4 polycrystalline SiC film
10 polycrystalline SiC article
20 single crystal SiC substrate
21 single crystal SiC layer
30 stacked SiC substrate

What is claimed is:

1. A polycrystalline SiC article formed by a CVD method and having:

a resistivity of 0.050 Ω·cm or less, and a peak ratio (A/B) of 0.015 to 0.100, wherein "A" is a peak indicating a stacking fault of the polycrystalline SiC material and represents a peak intensity within a wave number range of 760 to 780 cm$^{-1}$ in a Raman spectrum of the polycrystalline SiC article, and "B" is a peak indicating β-SiC and represents a peak intensity within a wave number range of 790 to 800 cm$^{-1}$ in the Raman spectrum of the polycrystalline SiC article.

2. The polycrystalline SiC article according to claim 1, wherein a content of nitrogen in the polycrystalline SiC article is 200 ppm (mass parts per million) or more.

3. The polycrystalline SiC article according to claim 1, wherein the article supports a single crystal SiC layer.

4. The polycrystalline SiC article according to claim 1, wherein the article is joined with a single crystal SiC layer.

\* \* \* \* \*